(12) United States Patent
Lambert et al.

(10) Patent No.: US 11,343,939 B2
(45) Date of Patent: May 24, 2022

(54) COMMUNICATION UPGRADE MODULE FOR COMMUNICATION WITH AN INFORMATION HANDLING SYSTEM AIR MOVER

(71) Applicant: Dell Products L.P., Round Rock, TX (US)

(72) Inventors: Timothy M. Lambert, Austin, TX (US); Eduardo Escamilla, Round Rock, TX (US); Hasnain Shabbir, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 40 days.

(21) Appl. No.: 16/850,925

(22) Filed: Apr. 16, 2020

(65) Prior Publication Data

US 2021/0325851 A1 Oct. 21, 2021

(51) Int. Cl.
*G05D 16/00* (2006.01)
*H05K 7/20* (2006.01)
*G05B 19/416* (2006.01)
*G06F 8/65* (2018.01)
*H05B 47/185* (2020.01)
*H02P 6/20* (2016.01)
*H02P 6/15* (2016.01)

(52) U.S. Cl.
CPC ....... *H05K 7/20209* (2013.01); *G05B 19/416* (2013.01); *G06F 8/65* (2013.01); *G05B 2219/49216* (2013.01); *H02P 6/15* (2016.02); *H02P 6/20* (2013.01); *H05B 47/185* (2020.01)

(58) Field of Classification Search
CPC .............. H05K 7/20209; G05B 19/416; G05B 2219/49216; G06F 8/65; H05B 47/185; H02P 6/20; H02P 6/15
See application file for complete search history.

(56) References Cited

U.S. PATENT DOCUMENTS

| | | | |
|---|---|---|---|
| 7,612,508 B2 | 11/2009 | Jreij et al. | |
| 2006/0152891 A1* | 7/2006 | Jreij | H05K 7/20209 361/676 |

* cited by examiner

*Primary Examiner* — Tuan A Vu
(74) *Attorney, Agent, or Firm* — Jackson Walker L.L.P.

(57) ABSTRACT

A communication module may be used in an information handling system comprising an air mover configured to drive a flow of air and a processing component communicatively coupled to the air mover for controlling operation of the air mover via a first wire configured to communicate air mover speed commands from the processing component to the air mover for controlling a speed of the air mover and a second wire configured to communicate tachometer information from the air mover to the processing component. The communication module may include a connector other than an air mover connector configured to couple the air mover to the first and second wire and logic configured to monitor for an escape sequence communicated via first wire from the processing component to enter a command mode and responsive to detecting the escape sequence, communicating information regarding the air mover to the processing component via second wire.

21 Claims, 3 Drawing Sheets

COMMUNICATION UPGRADE MODULE FOR COMMUNICATION WITH AN INFORMATION HANDLING SYSTEM AIR MOVER

TECHNICAL FIELD

The present invention relates in general to the field of information handling system cooling fan operations, and more particularly to a system and method for communication with an information handling system cooling fan using a communication upgrade module.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

With the growing importance of information handling systems to businesses and individuals, reliability has become an increasingly important factor in system design and selection. A growing number of components include monitoring subsystems that monitor for and report abnormal operations so that the risk of overall system failure and down time is decreased. If a failure of a component is detected or anticipated, the component is typically replaced as soon as practicable to avoid unnecessary downtime. Often, relatively inexpensive and non-complex components prove critical to the operation of an information handling system. For example, if one or more air movers of an information handling system fail, the system will quickly overheat, leading to automated shutdown by safety systems that detect the overheating or, worse, leading to catastrophic failure of one or more components.

Information handling system air movers typically run at variable speeds to provide variable amounts of cooling airflow. Running an air mover at a reduced speed helps reduce acoustic noise and power consumption where higher speeds are not needed to cool information handling system components. Typically a feedback system is used to control air mover speed so that speed increases with operating temperature increases and decreases with operating temperature decreases. One type of air mover feedback system works with a three-wire configuration: a power wire, a ground wire and a tachometer wire. The tachometer wire provides air mover speed measurements to a thermal control system of the information handling system. The thermal control system may adjust the air mover speed in response to changes in operating temperature by adjusting the power applied to the power wire. Another type of air mover feedback system works with a four-wire configuration: a power wire, a ground wire, a tachometer wire, and a pulse width modulation (PWM) wire. Instead of controlling air mover speed by varying the application of power, in four-wire air movers air mover speed commands are sent through the PWM wire so that a microcontroller on the air mover adjusts air mover speed with a constant voltage supply.

In many instances, it may be desirable to enable two-way communication with an air mover beyond the communication of PWM and tachometer signals. For example, it may be desirable to enable communication that allows for retrieval of information from the air mover besides tachometer signals, such as data stored in a field-replaceable unit of the air mover, dynamic data associated with the air mover (e.g., odometer, uptime, current consumption), logs or other diagnostic data. As another example, it may be desirable to enable communication of information to the air mover other than PWM signals, such as special commands or programming (e.g., firmware updates to the air mover).

While some solutions exist integrating such advanced communication techniques into air movers, such solutions have disadvantages. For example, introducing communication functionality into an air mover may lead to design complexity as additional communication wires may be needed and existing electrical architectures of air movers and cables coupling air movers to thermal control systems may require modification. Also, such solutions do not often provide the option to an end user or a manufacturer or information handling systems to select between air movers without such additional communication capability and with such additional communication capability.

SUMMARY

In accordance with the teachings of the present disclosure, the disadvantages and problems associated with traditional approaches to cooling information handling system components may be substantially reduced or eliminated.

In accordance with embodiments of the present disclosure, an information handling system may include an air mover configured to drive a flow of air, a processing component, and a communication module. The processing component may be communicatively coupled to the air mover for controlling operation of the air mover via a first wire configured to communicate air mover speed commands from the processing component to the air mover for controlling a speed of the air mover and a second wire configured to communicate tachometer information from the air mover to the processing component. The communication module may be coupled to the first wire and the second wire via a connector other than an air mover connector configured to couple the air mover to the first wire and the second wire, and the communication module may be configured to monitor for an escape sequence communicated over the first wire from the processing component to enter a command mode and responsive to detecting the escape sequence, communicating information regarding the air mover to the processing component via the second wire.

In accordance with these and other embodiments of the present disclosure, a method may include, in an information handling system comprising an air mover configured to drive a flow of air and a processing component communicatively coupled to the air mover for controlling operation of the air mover via a first wire configured to communicate air mover speed commands from the processing component to the air mover for controlling a speed of the air mover and a second wire configured to communicate tachometer information from the air mover to the processing component, monitoring, with a communication module coupled to the first wire and the second wire via a connector other than an air mover connector configured to couple the air mover to the first wire and the second wire an escape sequence communicated over the first wire from the processing component to enter a command mode. The method may also include responsive to detecting the escape sequence, communicating information regarding the air mover from the communication module to the processing component via the second wire.

In accordance with these and other embodiments of the present disclosure, a communication module may be provided for use in an information handling system comprising an air mover configured to drive a flow of air and a processing component communicatively coupled to the air mover for controlling operation of the air mover via a first wire configured to communicate air mover speed commands from the processing component to the air mover for controlling a speed of the air mover and a second wire configured to communicate tachometer information from the air mover to the processing component. The communication module may include a connector other than an air mover connector configured to couple the air mover to the first wire and the second wire and logic configured to monitor for an escape sequence communicated over the first wire from the processing component to enter a command mode and responsive to detecting the escape sequence, communicating information regarding the air mover to the processing component via the second wire.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
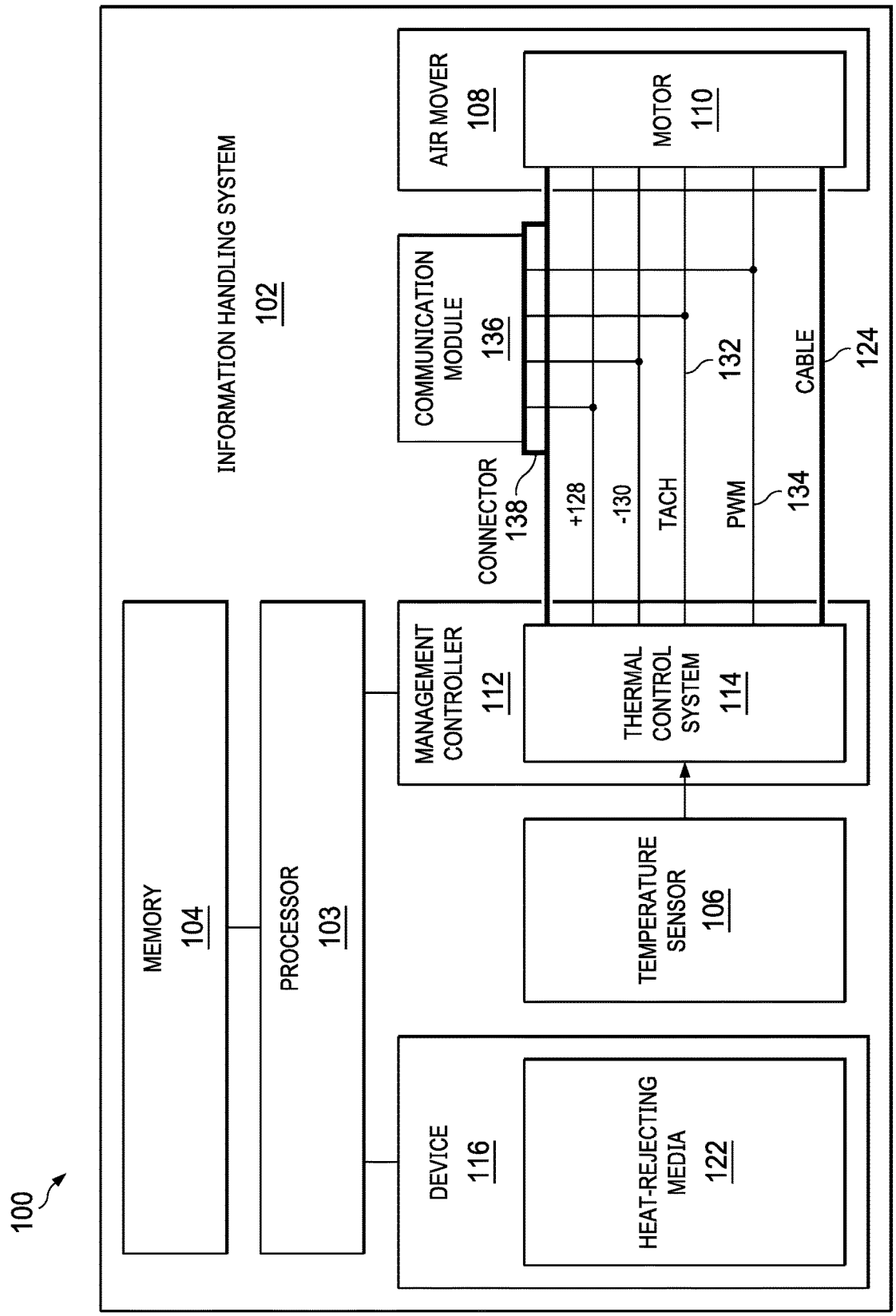
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, an air mover 108, a management controller 112, a cable 124 for communicatively coupling air mover 108 to management controller 112, a device 116, heat-rejecting media 122, and a communication module 136 communicatively coupled to cable 124 via connector 138.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 may also be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108 (e.g., a pulse-width modulation signal on PWM wire 134 of cable 124). In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirements of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to management controller 112 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

As shown in FIG. 1, device 116 may have mechanically and thermally coupled thereto heat-rejecting media 122. Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, fin-stack, etc.) such that heat generated by the information handling resource is transferred from the information handling resource into air surrounding the information handling resource. For example, in the embodiments represented by FIG. 1, heat-rejecting media 122 may be thermally coupled to device 116 and arranged such that heat generated by device 116 is transferred to air driven by air mover 108.

As mentioned above, a cable 124 may communicatively couple air mover 108 to thermal control system 114 and management controller 112. Cable 124 may comprise a plurality of electrically-conductive wires (which may be electrically insulated from one another) running generally parallel along the length of cable 124. Cable 124 may also include suitable terminations at each end of cable 124, for example a connector (not explicitly shown) for coupling to management controller 112 and a connector (not explicitly shown) for coupling to air mover 108. As shown in FIG. 1, cable 124 may also comprise a connector 138 for coupling communication module 136 to cable 124.

As shown in FIG. 1, cable 124 may include a power (+) wire 128, ground (−) wire 130, tachometer (tach) wire 132, and PWM wire 134. Thus, in operation, power wire 128 and ground wire 130 may provide electrical energy to motor 110 to drive air flow from air mover 108. Thermal control system 114 may control a speed of air mover 108 via a driving signal (e.g., a serial pulse width modulated signal) communicated via PWM wire 134. A tachometer (not expressly shown in FIG. 1) of motor 110 (or a rotor of air mover 108) may generate a signal indicative of a speed of air mover 108, which may be communicated via tach wire 132 to thermal control system 114, thus providing feedback to thermal control system 114 to enable thermal control system 114 to determine an appropriate driving signal by considering the measured air mover speed received via tach wire 132.

Connector 138 may be communicatively coupled to cable 124 and may comprise any suitable system, device, or apparatus (e.g., a receptacle connector) configured to communicatively couple a removable communication module 136 (e.g., having a corresponding edge connector) to cable 124. For example, connector 138 may include electrically conductive paths allowing corresponding electrical conduits (e.g., pins or pads) of communication module 136 to electrically and communicatively coupled to power wire 128, ground wire 130, tach wire 132, and PWM wire 134.

Communication module 136 may comprise any suitable system, device, or apparatus (e.g., a printed circuit board) configured to electrically and mechanically couple to connector 138, which may enable communication of information associated with air mover 108 other than the typical tachometer signal communicated over tach wire 132 and the driving signal communicated over PWM wire 134. Functionality of communication module 136 is described in greater detail below.

In addition to processor 103, memory 104, temperature sensor 106, air mover 108, management controller 112, cable 124, device 116, heat-rejecting media 122, communication module 136, and connector 138, information handling system 102 may include one or more other information handling resources. In addition, for the sake of clarity and exposition of the present disclosure, FIG. 1 depicts only one air mover 108 and one device 116. In embodiments of the present disclosure, information handling system 102 may include any number of air movers 108 and devices 116. However, in some embodiments, approaches similar or identical to those used to cool device 116 as described herein may be employed to provide cooling of processor 103, memory 104, management controller 112, and/or any other information handling resource of information handling system 102.

Under normal operations, thermal control system 114 of management controller 112 may control information handling system 102's internal temperature by varying the speed of air mover 108. However, by communicating particular signals over tach wire 132 and/or PWM wire 134, management controller 112 may cause communication module 136 to enter a command mode. For example, in order to enter the command mode, management controller 112 may communicate via PWM wire 134 an escape sequence of predetermined power setting commands. For instance, the escape sequence may include management controller 112 toggling a duty cycle of PWM wire 134 between 100% and 0% four times within one second, or some other suitable sequence. In turn, when installed in connector 138, communication module 136 may monitor for the escape sequence, and in response to the escape sequence, may enter the command mode. Once in the command mode, management controller 112 may communicate other command sequences via PWM wire 134 (or, in some embodiments, over tach wire 132), and communication module 136 may respond to such command sequences by communicating responsive information to management controller 112 via tach wire 132.

Because a tachometer of air mover 110 may still communicate actual tachometer data over tach wire 132, communication module 136 may be configured to, in the command mode, overdrive the tachometer signal generated by air mover 110. Thus, when not in the command mode, communication module 136 may present a high electrical impedance to tech wire 132, but when in the command mode, may present an electrical impedance lower than that of the portion of air mover 110 driving tach wire 132 to enable such overdrive. Similarly, in the command mode, management controller 112 may be configured to read information communicated on tach wire 132 by communication module 136, while filtering out tachometer data communicated from air mover 108. Because management controller 112 should, based on the most recent driving signal communicated on PWM wire 134, have a general awareness of actual tachometer speed being output by air mover 108, management controller 112 may in essence be able to treat the actual tachometer speed signal being output by air mover 108 as a carrier wave signal upon which information communicated by communication module 136 on tach wire 132 is carried.

Information communicated from communication module 136 onto tach wire 132 may include any suitable information, including without limitation, information in a field-replaceable unit associated with air mover 108, fault data associated with air mover 108, other log, diagnostic, or black box data associated with air mover 108, identifying information (e.g., model type, serial number, etc.) regarding air mover 108, dynamic data associated with air mover 108 (e.g., odometer, uptime, current consumption), and/or any other suitable information. In some embodiments, communication via tach wire 132 may be bidirectional, allowing management controller 112 to also communicate information or commands to communication module 136 via tach wire 132. For example, in such embodiments, management controller 112 may communicate a firmware upgrade to communication module 136 (which may further apply the firmware upgrade to air mover 108) via tach wire 132.

Once in the command mode, management controller 112 may exit the command mode and cause communication module 136 to likewise exit the command mode by communicating an appropriate escape sequence via PWM wire 134.

Because communication module 136 may be optionally provided, it may serve as an upgrade option for upgrading an otherwise "unintelligent" air mover 108 into an intelligent air mover 108 without requiring significant changes or alteration to air mover 108.

Figure 2:
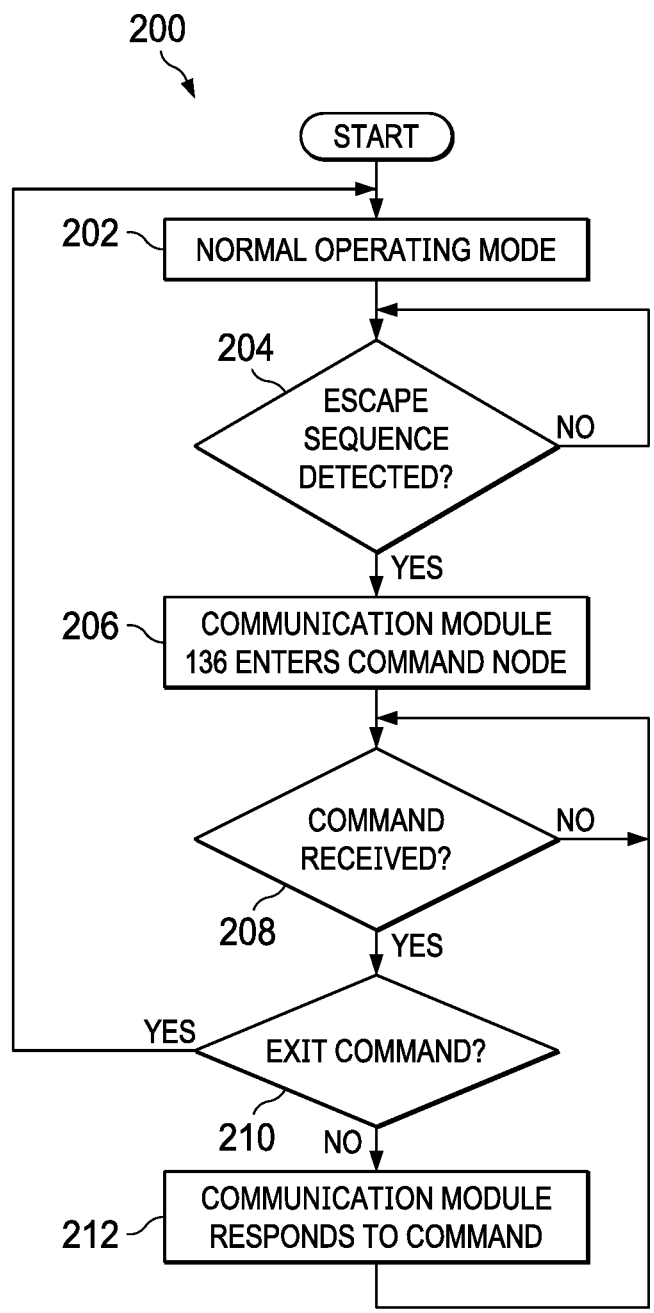
FIG. 2 illustrates a flow chart of an example method for establishing a communication link between a management controller and a communication module, in accordance with embodiments of the present disclosure.

FIG. 2 illustrates a flow chart of an example method 200 for establishing a communication link between a management controller and a communication module, in accordance with embodiments of the present disclosure. According to some embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, management controller 112 may operate in a normal operating mode in which air mover 108 responds to driving commands from management controller 112 via PWM wire 134 and air mover 108 may in turn output tachometer data via tach wire 132. During the normal operating mode, communication module 136 may present a high electrical impedance to tach wire 132.

At step 204, while in the normal mode, communication module 136 may monitor for an escape sequence on PWM wire 134. Method 200 may remain at step 204 until communication module 136 detects the escape sequence. Once the escape sequence is detected, method 200 may proceed to step 206.

At step 206, in response to receipt of the escape sequence, communication module 136 may enter the command mode. At step 208, communication module 136 may wait for receipt of a command from management controller 112. Method 200 may remain at step 208 until communication module 136 receives a command. Once a command is received, method 200 may proceed to step 210.

At step 210, in response to receipt of a command, communication module 136 may determine whether the command is a command to exit the command mode. If the command is a command to exit the command mode, method 200 may proceed again to step 202. If the command is not an exit command, method 200 may proceed to step 212.

At step 212, in response to the command, communication module 136 may communicate a response to the command on tach wire 132. However, it should be noted that in some embodiments, communication module 136 may communicate information in the absence of receiving a command. For example, in some embodiments, communication module 136 may be configured by default to communicate some information (e.g., once or at periodic intervals) when in the command mode. After completion of step 212, method 200 may proceed again to step 208.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using information handling system 102 or any other system operable to implement method 200. In certain embodiments, method 200 may be implemented partially or fully in software and/or firmware embodied in computer-readable media.

Figure 3A:
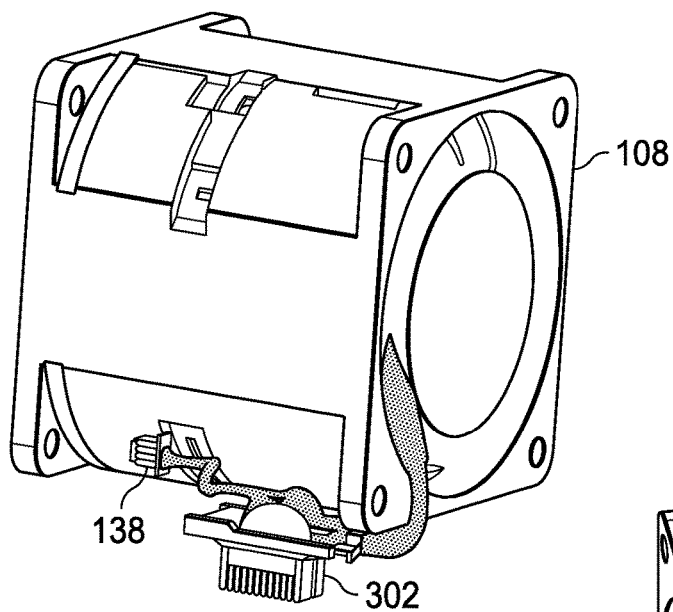
FIG. 3A illustrates a perspective view of an air mover with a connector for a communication module, in accordance with embodiments of the present disclosure.

FIG. 3A illustrates a perspective view of air mover 108 with connector 138 for communication module 136, in accordance with embodiments of the present disclosure. As shown in FIG. 3A, air mover 108 may have an air mover connector 302 configured to couple to cable 124. One difference between that depicted in FIG. 3A and information handling system 102 in FIG. 1 is that connector 138 has air mover connector 302 interfaced between connector 138 and cable 124. Nonetheless, the arrangement shown in FIG. 3A shall have similar or identical functionality to that shown in FIG. 1.

Figure 3B:
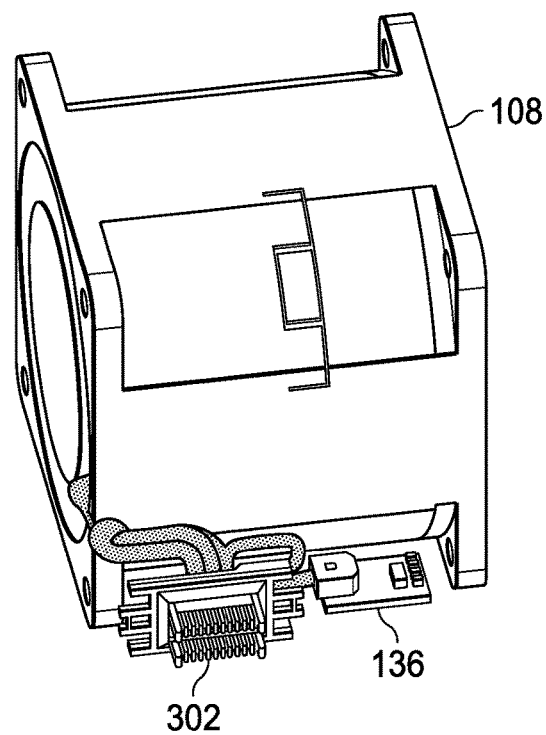
FIG. 3B illustrates a perspective view of an air mover with a communication module inserted in its corresponding connector, in accordance with embodiments of the present disclosure.
Figure 3C:
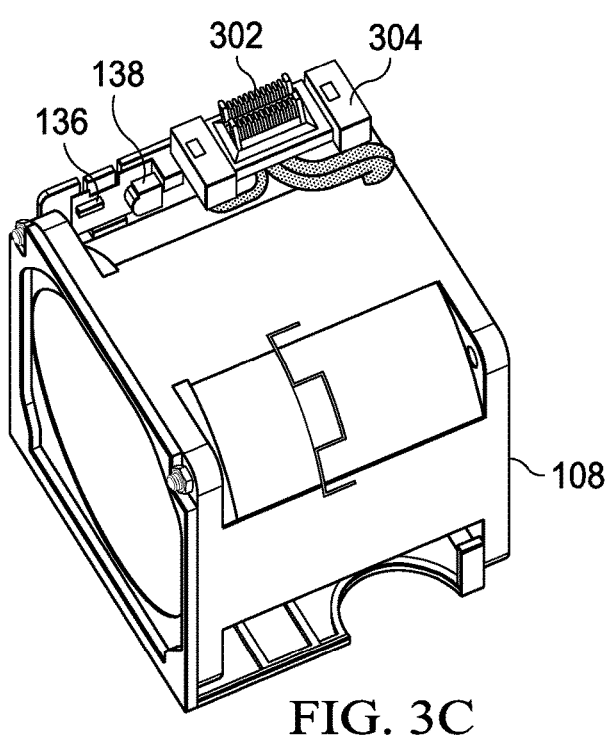
FIG. 3C illustrates a perspective view of an air mover with a communication module inserted in its corresponding connector and mechanical features for retaining the connector and communication module, in accordance with embodiments of the present disclosure.

FIG. 3B illustrates a perspective view of air mover 108 with communication module 136 inserted in its corresponding connector 138, in accordance with embodiments of the present disclosure. FIG. 3C illustrates a perspective view of air mover 108 with communication module 136 inserted in its corresponding connector 138 and mechanical features 304 for retaining connector 138 and communication module 136, in accordance with embodiments of the present disclosure. Mechanical features 304 may include any suitable system, device, or apparatus (e.g., a bracket) configured to maintain connector 138 and communication module 136 in a fixed position relative to air mover 108, and may include any suitable mechanical members for performing such functionality.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    an air mover configured to drive a flow of air;
    a processing component communicatively coupled to the air mover for controlling operation of the air mover via:
        a first wire configured to communicate air mover speed commands from the processing component to the air mover for controlling a speed of the air mover; and
        a second wire configured to communicate tachometer information from the air mover to the processing component; and
    a removable communication module coupled to the first wire and the second wire via a connector other than an air mover connector configured to couple the air mover to the first wire and the second wire, such that the air mover remains communicatively coupled to the processing component via the first wire and the second wire when the removable communication module is removed from the connector, the removable communication module configured to:
        monitor for an escape sequence communicated over the first wire from the processing component to enter a command mode; and
        responsive to detecting the escape sequence, communicating information regarding the air mover to the processing component via the second wire.

2. The information handling system of claim 1, wherein the removable communication module is further configured to, responsive to detecting the escape sequence, receive information from the processing component via the second wire.

3. The information handling system of claim 1, wherein the removable communication module is further configured to, responsive to detecting the escape sequence, enter the command mode.

4. The information handling system of claim 3, wherein the removable communication module is further configured to, during the command mode:
    monitor for a command from the processing component via at least one of the first wire and the second wire; and
    responsive to receiving the command, communicate information to the processing component via the second wire.

5. The information handling system of claim 3, wherein the removable communication module is further configured to, during the command mode:
    monitor for a command from the processing component via at least one of the first wire and the second wire;
    determine whether the command is a command for exiting the command mode; and
    responsive to receiving the command for exiting the command mode, exit the command mode.

6. The information handling system of claim 1, wherein the connector is mechanically coupled to the air mover.

7. The information handling system of claim 1, wherein the connector is configured such that the air mover connector is coupled between the processing component and the connector.

8. A method comprising, in an information handling system comprising an air mover configured to drive a flow of air and a processing component communicatively coupled to the air mover for controlling operation of the air mover via a first wire configured to communicate air mover speed commands from the processing component to the air mover for controlling a speed of the air mover and a second wire configured to communicate tachometer information from the air mover to the processing component:
    monitoring, with a removable communication module coupled to the first wire and the second wire via a connector other than an air mover connector configured to couple the air mover to the first wire and the second wire, such that the air mover remains communicatively coupled to the processing component via the first wire and the second wire when the removable communication module is removed from the connector, for an escape sequence communicated over the first wire from the processing component to enter a command mode; and
    responsive to detecting the escape sequence, communicating information regarding the air mover from the removable communication module to the processing component via the second wire.

9. The method of claim 8, further comprising, responsive to detecting the escape sequence, receiving information at the removable communication module from the processing component via the second wire.

10. The method of claim 8, further comprising, responsive to detecting the escape sequence, entering the command mode.

11. The method of claim 10, further comprising, during the command mode:
    monitoring at the removable communication module for a command from the processing component via at least one of the first wire and the second wire; and
    responsive to receiving the command, communicating information from the removable communication module to the processing component via the second wire.

12. The method of claim 10, further comprising, during the command mode:
    monitoring at the removable communication module for a command from the processing component via at least one of the first wire and the second wire;
    determining at the removable communication module whether the command is a command for exiting the command mode; and
    responsive to receiving the command for exiting the command mode, exiting the command mode.

13. The method of claim 8, wherein the connector is mechanically coupled to the air mover.

14. The method of claim 8, wherein the connector is configured such that the air mover connector is coupled between the processing component and the connector.

15. A removable communication module for use in an information handling system comprising an air mover configured to drive a flow of air and a processing component communicatively coupled to the air mover for controlling operation of the air mover via a first wire configured to communicate air mover speed commands from the processing component to the air mover for controlling a speed of the air mover and a second wire configured to communicate tachometer information from the air mover to the processing component, the removable communication module comprising:
  a connector other than an air mover connector configured to couple the air mover to the first wire and the second wire, such that the air mover remains communicatively coupled to the processing component via the first wire and the second wire when the removable communication module is removed from the connector; and
  logic configured to:
    monitor for an escape sequence communicated over the first wire from the processing component to enter a command mode; and
    responsive to detecting the escape sequence, communicating information regarding the air mover to the processing component via the second wire.

16. The removable communication module of claim 15, wherein the logic is further configured to, responsive to detecting the escape sequence, receive information from the processing component via the second wire.

17. The removable communication module of claim 15, wherein the logic is further configured to, responsive to detecting the escape sequence, enter the command mode.

18. The removable communication module of claim 17, wherein the logic is further configured to, during the command mode:
  monitor for a command from the processing component via at least one of the first wire and the second wire; and
  responsive to receiving the command, communicate information to the processing component via the second wire.

19. The removable communication module of claim 17, wherein the logic is further configured to, during the command mode:
  monitor for a command from the processing component via at least one of the first wire and the second wire;
  determine whether the command is a command for exiting the command mode; and
  responsive to receiving the command for exiting the command mode, exit the command mode.

20. The removable communication module of claim 15, wherein the connector is mechanically coupled to the air mover.

21. The removable communication module of claim 15, wherein the connector is configured such that the air mover connector is coupled between the processing component and the connector.

* * * * *